US012279369B2

(12) United States Patent
Reitmaier et al.

(10) Patent No.: US 12,279,369 B2
(45) Date of Patent: *Apr. 15, 2025

(54) ELECTRICALLY CONNECTED COMPONENT CARRIER STACKS WITH RESPECTIVE CAVITIES AND METHOD OF MANUFACTURING THE SAME

(71) Applicant: AT&S Austria Technologie & Systemtechnik Aktiengesellschaft, Leoben (AT)

(72) Inventors: Bernhard Reitmaier, Pölstal/Möderbrugg (AT); Sebastian Sattler, Graz (AT); Erich Schlaffer, St. Lorenzen (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 432 days.

This patent is subject to a terminal disclaimer.

(21) Appl. No.: 17/660,258

(22) Filed: Apr. 22, 2022

(65) Prior Publication Data

US 2022/0248532 A1   Aug. 4, 2022

Related U.S. Application Data

(63) Continuation-in-part of application No. 16/946,053, filed on Jun. 4, 2020, now Pat. No. 11,322,482.

(30) Foreign Application Priority Data

Jul. 10, 2019   (EP) ..................................... 19185550

(51) Int. Cl.
*H05K 1/11*   (2006.01)
*H05K 1/18*   (2006.01)
(Continued)

(52) U.S. Cl.
CPC ............. *H05K 1/115* (2013.01); *H05K 1/186* (2013.01); *H05K 3/321* (2013.01); *H05K 3/4655* (2013.01);
(Continued)

(58) Field of Classification Search
CPC ........ H05K 1/115; H05K 1/186; H05K 3/321; H05K 3/4655; H05K 3/4697
(Continued)

(56) References Cited

U.S. PATENT DOCUMENTS 6,815,739 B2   11/2004   Huff et al.
7,196,274 B2   3/2007   Cooper et al.
(Continued)

FOREIGN PATENT DOCUMENTS

WO   2007149046 A1   12/2007
WO   2015149097 A1   10/2015

OTHER PUBLICATIONS

Degroote, B.; Extended European Search Report in Application No. 19185550.1; Mar. 27, 2020; pp. 1-10; European Patent Office; 80298, Munich, Germany.
(Continued)

*Primary Examiner* — Quoc D Hoang
(74) *Attorney, Agent, or Firm* — Robert A. Blaha; Smith Tempel Blaha LLC

(57) ABSTRACT

A component carrier includes a first stack having at least one first electrically insulating layer structure and at least one first electrically conductive layer structure, and a second stack with at least one second electrically insulating layer structure and at least one second electrically conductive layer structure. The first stack and the second stack are connected with each other so that a vertical two-dimensional electrically conductive connection is established. The first stack has a first cavity and the second stack has a second
(Continued)

cavity, the first cavity and the second cavity being separated by at least one further electrically insulating layer structure. At least one of the first cavity and the second cavity is delimited by a wall being at least partially lined with an electrically conductive coating.

20 Claims, 5 Drawing Sheets

(51) Int. Cl.
*H05K 3/32* (2006.01)
*H05K 3/46* (2006.01)

(52) U.S. Cl.
CPC . *H05K 3/4697* (2013.01); *H05K 2201/09563* (2013.01)

(58) Field of Classification Search
USPC .......................................................... 257/133
See application file for complete search history.

(56) References Cited

U.S. PATENT DOCUMENTS

| | | | |
|---|---|---|---|
| 11,322,482 B2* | 5/2022 | Reitmaier | H01L 23/5385 |
| 2002/0170171 A1 | 11/2002 | Miyazaki et al. | |
| 2005/0121225 A1 | 6/2005 | Hsu | |
| 2007/0278644 A1 | 12/2007 | Hsu et al. | |
| 2017/0318685 A1 | 11/2017 | Chen et al. | |
| 2018/0233423 A1 | 8/2018 | Lobianco et al. | |
| 2018/0233484 A1 | 8/2018 | Lin et al. | |
| 2018/0277517 A1 | 9/2018 | Kim et al. | |
| 2018/0324960 A1 | 11/2018 | Lee | |
| 2020/0203272 A1 | 6/2020 | Doebler et al. | |

OTHER PUBLICATIONS

"Impedanz"; Wikipedia as downloaded on Jun. 4, 2020; pp. 1-6; from https://de.wikipedia.org/wiki/Impedanz, last edited on May 24, 2020.

"Impedanzanpassung"; Wikipedia as downloaded on Jun. 4, 2020; pp. 1-3; from https://de.wikipedia.org/wiki/Impedanzanpassung, last edited on Oct. 28, 2019.

* cited by examiner

ELECTRICALLY CONNECTED COMPONENT CARRIER STACKS WITH RESPECTIVE CAVITIES AND METHOD OF MANUFACTURING THE SAME

CROSS-REFERENCE TO RELATED APPLICATIONS

This application is a continuation-in-part of U.S. patent application Ser. No. 16/946,053, filed Jun. 4, 2020, which application claimed the benefit of the filing date of the European Patent Application No. 19185550.1, filed Jul. 10, 2019, the disclosures of which are hereby incorporated herein by reference.

TECHNICAL FIELD

Embodiments of the present invention relate to a component carrier, to a method of manufacturing a component carrier, and to a method of use.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

Moreover, artefacts may occur when high-frequency signals propagating along wiring structures of a component carrier mix or multiply with each other to generate distorted signals. Also signal reflection is an undesired phenomenon. This can substantially degrade the overall performance of mobile communication systems, etc.

SUMMARY

There may be a need for a component carrier with high performance in terms of high-frequency applications.

According to exemplary embodiments of the invention, a component carrier, a method of manufacturing a component carrier, and a method of use according to the independent claims are provided.

According to an exemplary embodiment of the invention, a component carrier is provided which comprises a first stack comprising at least one first electrically insulating layer structure and at least one first electrically conductive layer structure having a first connection body with a first (in particular exposed) planar electrically conductive surface, and a second stack comprising at least one second electrically insulating layer structure and at least one second electrically conductive layer structure having a second connection body with a second (in particular exposed) planar electrically conductive surface, wherein the first stack and the second stack are connected with each other so that the first (in particular exposed) planar electrically conductive surface and the second (in particular exposed) planar electrically conductive surface are (in particular at least also mechanically) connected to establish a vertical two-dimensional electrically conductive connection (or planar connection or areal connection).

According to another exemplary embodiment of the invention, a method of manufacturing a component carrier is provided, wherein the method comprises providing a first stack comprising at least one first electrically insulating layer structure and at least one first electrically conductive layer structure having a first connection body with a first exposed planar electrically conductive surface, providing a second stack comprising at least one second electrically insulating layer structure and at least one second electrically conductive layer structure having a second connection body with a second exposed planar electrically conductive surface, and thereafter connecting the first stack and the second stack with each other to thereby (in particular at least also mechanically) connect the first exposed planar electrically conductive surface and the second exposed planar electrically conductive surface to establish a vertical two-dimensional electrically conductive connection.

According to still another exemplary embodiment of the invention, a component carrier having the above-mentioned features is used for a high-frequency application, in particular for conducting a radio frequency (RF) signal, in particular a radio frequency signal with a frequency above 1 GHz. Additionally or alternatively, a component carrier having the above-mentioned features may be used for a high-power application (in particular using one or more semiconductor power chips and/or an electric current of at least 1 Ampère, in particular at least 10 Ampère).

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "high-frequency application" may particularly denote a task fulfilled by the component carrier or to which the component carrier contributes, wherein the task may relate to the handling of a radio frequency signal. Such a radio or high-frequency signal may be an electric or electromagnetic signal propagating along a wiring structure of a component carrier in a range of frequencies used for communications or other signals. In particular, a radio-frequency (RF) signal may for example have a frequency in the range between 3 kHz and 300 GHz.

In the context of the present application, the term "connection body with exposed planar electrically conductive surface" may particularly denote an electrically conductive body which has a flat or even connection surface to be connected with a respectively cooperating other exposed planar electrically conductive surface of another connection body.

In the context of the present application, the term "establish a two-dimensional electrically conductive connection" may particularly denote that a connection area between said exposed planar electrically conductive surfaces may be an extended two-dimensional area rather than a point contact or an edge contact. Thus, said two planar electrically conductive surfaces may lie face to face so that abutting flange faces of the electrically conductive surfaces may form a large area connection. The connection between the planar electrically conductive surfaces may be direct (i.e., without material in between) or indirect (i.e., with material in between).

In the context of the present application, the term "at least also mechanically connected surfaces" may particularly denote that a connection between said exposed planar electrically conductive surfaces may be accomplished by establishing a mechanical interaction between the readily manufactured connection bodies with said exposed planar electrically conductive surfaces, for instance by pressing them together (with or without electrically conductive material in between). This connection mechanism may however be optionally combined with a further connection technology, for instance the provision of an additional connection medium (such as a sinter or solder medium) on a respective one of the exposed planar electrically conductive surfaces, etc.

According to an exemplary embodiment of the invention, a component carrier may be manufactured in which an electric contact over multiple stacked layer structures may be established by (for instance purely mechanically) coupling two preformed exposed planar electrically conductive surfaces rather than drilling a via and filling the latter subsequently with electrically conductive material by plating. By taking this measure, limitations (in particular in terms of shape and form) of manufacturing (in particular high-frequency capable) component carriers are relaxed, while nevertheless allowing for a reliable and low ohmic electric connection between the opposing connection bodies with exposed planar electrically conductive surfaces (for instance as directly or indirectly abutting flange faces). In particular, such an architecture of forming electric connections in a component carrier may be highly advantageous in particular for high frequency applications, since the formation of a two-dimensional electrical connection between the planar electrically conductive surfaces of different stacks may avoid an undesired reflection of electromagnetic signals at an interface. The two-dimensional electric contact in combination with the freely selectable geometry of the exposed planar electrically conductive surfaces enables carrying out measures (for instance an impedance matching) to adjust the component carrier to comply with high frequency requirements.

According to an exemplary embodiment of the invention, a component carrier is provided with a mechanically connected arrangement of planar connection bodies for establishing a two-dimensional vertical planar face-to-planar face-interconnect. This may enable a replacement of conventional oblong buried vias for providing arbitrarily shaped interconnections. Furthermore, such a connection architecture may remove an influence of dielectric material (such as prepreg) or electrically conductive material (for instance silver paste) flowing into undesired regions (in particular in one or more cavities) of the component carrier during manufacture, in particular during lamination and/or electric interconnection. Hence, exemplary embodiments of the invention may show improved radio-frequency (RF) performance. Moreover, cross-sectional shapes of the connected connection bodies have no shape restriction and can be placed directly at the needed position (for instance a cavity in an interior of the component carrier). Furthermore, such a manufacturing concept may enable creating a substantially continuous shield for shielding electromagnetic radiation. Beyond this, such a concept involves no influence of glue used for connecting stacks of the component carrier during manufacture on the RF performance of the readily manufactured component carrier. Hence, exemplary embodiments of the invention may make it possible to create smarter interconnections. In particular, an exemplary embodiment may connect copper layers through different kinds of vias to form an electrical connection structure inside a component carrier, such as a printed circuit board.

In the following, further exemplary embodiments of the component carrier and the methods will be explained.

In particular, the vertical two-dimensional electrically conductive connection may be established by vertically approaching the connection bodies until an electrically conductive connection is established by the planar electrically conductive surfaces of said connection bodies abutting with each other either directly or with electrically conductive material in between. Such an electrically conductive material in between may be a connection medium like solder paste or sinter paste, as shown for instance in FIG. 3. Additionally or alternatively, such an electrically conductive material in between may be at least one electrically conductive structure (for instance a metal filled via, in particular having an aspect ratio between height and diameter below 1) also having two opposing planar electrically conductive surfaces, as shown for instance in FIG. 1.

In an embodiment, the first connection body forms at least part of a first copper-clad and the second connection body forms at least part of a second copper-clad, wherein the connection between the first stack and the second stack is established by (in particular directly or indirectly) connecting said first copper-clad and said second copper-clad. Thus, a gist of an exemplary embodiment of the invention lies on the two mutually connected copper-clads. A microvia is one example of how to electrically connect those two copper-clads. Other possibilities besides microvias would be an electrically conductive plated through contact, a copper paste, copper blocks, deep routing, laser slots, etc. The copper-clads can also be connected directly with each other.

In an embodiment, the first exposed planar electrically conductive surface and the second exposed planar electrically conductive surface are at least also mechanically connected to establish an electrically conductive connection in between over a whole surface area of the first exposed planar electrically conductive surface and a whole surface area of the second exposed planar electrically conductive surface. In other words, the entire opposing surface areas of said exposed planar electrically conductive surfaces at the flange faces of the connection bodies may be used for establishing said contact.

In an embodiment, the first exposed planar electrically conductive surface and the second exposed planar electrically conductive surface have substantially the same shape and/or substantially the same surface area. In particular, the opposing exposed planar electrically conductive surfaces may have the same perimeter and may have the same size. This ensures a mutually well-defined connection between the connection bodies.

In an embodiment, the first exposed planar electrically conductive surface and the second exposed planar electrically conductive surface are parallel. Both electrically conductive surfaces may be even or flat and may be connected so that the planes defining said surfaces are arranged parallel to each other.

In an embodiment, the first exposed planar electrically conductive surface and the second exposed planar electrically conductive surface are also connected by at least one of a vertical interconnect body (such as a metal filled via) and an electrically conductive connection medium (in particular at least one of a solder structure, a sinter structure, and an electrically conductive glue). Such an electrically conductive connection medium may for instance be used for reducing a contact resistance between the abutting electrically conductive surfaces. Moreover, such an electrically conductive connection medium may be configured for accomplishing impedance matching between the connected connection bodies. A vertical interconnect body sandwiched between the connection bodies may allow connecting the connecting bodies through a central third stack.

In another embodiment, the first exposed planar electrically conductive surface and the second exposed planar electrically conductive surface are in direct contact with each other. Thus, a direct physical contact may be established between the exposed planar electrically conductive surfaces, to thereby obtain a well-defined and low ohmic connection.

In an embodiment, at least one of the first connection body and the second connection body has a non-circular cross-section, in particular a rectangular cross-section. Additionally or alternatively, at least one of the first exposed planar electrically conductive surface and the second exposed planar electrically conductive surface may have a non-circular surface area, in particular a rectangular surface area. In view of the mechanically accomplished (in particular pressure triggered) connection between the opposing connection bodies at their exposed planar electrically conductive surfaces, any desired cross-section of the connection bodies is possible. This is contrary to the usual formation of copper-filled vias with a circular cross-section. In particular, a rectangular cross-section may be advantageous in particular for the transmission of electromagnetic signals in the high frequency domain.

In an embodiment, the at least one first electrically conductive layer structure comprises a first electrically conductive trace in a first horizontal plane and connected with the first connection body, wherein the at least one second electrically conductive layer structure comprises a second electrically conductive trace in a second horizontal plane and connected with the second connection body. The electrically conductive traces in the different planes may be interconnected by the connected connection bodies. Thus, the connection architecture according to exemplary embodiments of the invention may enable in a simple way a connection of different electrically conductive traces running in different parallel planes by a vertical through-connection established by the usually connected exposed planar electrically conductive surfaces.

In an embodiment, the first exposed planar electrically conductive surface and the second exposed planar electrically conductive surface are impedance matched. Each trace and connection body has a characteristic impedance. If different impedances are abutting to each other, an at least partial reflection of an electromagnetic signal may occur, and thus signal losses in particular in the high frequency domain. When carrying out impedance matching between the adjacent connection bodies at the exposed planar electrically conductive surfaces, such reflection losses may be advantageously avoided or at least significantly reduced.

Impedance matching may be measured by carrying out a network analysis (in particular using a vector network analysis device) allowing to measure signal attenuation and signal reflection. Thus, the electrically connected exposed planar electrically conductive surfaces of the connection bodies may be advantageously configured for establishing matched impedances.

In an embodiment, the first stack comprises a first cavity and the second stack comprises a second cavity being separated by at least one further electrically insulating layer structure which is traversed by at least one of the connected connection bodies and/or by a vertical interconnect body between the connected connection bodies. In such an embodiment, cavities in the connected stacks may be implemented for forming a resonator volume in an interior of the component carrier. Descriptively speaking, such a resonator volume may be shaped and dimensioned for enabling a specific wavelength of electromagnetic radiation to create a standing or stationary wave in the resonator volume. A correspondingly configured component carrier may thus function as a frequency filter. The at least one further electrically insulating layer structure coupling and spatially separating the cavities may be configured for fine-tuning the filter characteristics of such a component carrier.

In an embodiment, at least one of the first cavity and the second cavity is at least partially delimited by a wall being lined with an electrically conductive coating. Correspondingly, the electrically conductive coating may be electrically coupled with at least one of the connected connection bodies. Such an electrically conductive coating may be a copper layer. Highly advantageously, the entire cavities (in particular only with an exception of one or more through-holes formed for signal supply and signal lead away out of the cavities) may be lined with electrically conductive coatings. Thus, a substantially hermetic shielding of electromagnetic radiation may be achieved by such a cage formed by the coatings. Preferably, the electrically conductive coating of both cavities may be short-circuited by the connection bodies connected via their exposed planar electrically conductive surfaces. Taking this measure may be highly advantageous for forming a resonator for microwaves.

In an embodiment, the wall delimiting the first cavity and the second cavity forms a smooth surface. As smooth surface of the wall delimiting the first cavity and the second cavity according to the embodiment may be a surface having a surface roughness (Ra) of less than 500 nm, in particular less than 300 nm, more in particular less than 100 nm.

In an embodiment, the first cavity and the second cavity have the same vertical height, or wherein the first cavity and the second cavity differ in its vertical height less than 100 μm preferably less than 50 μm more preferably less than 20 μm. The vertical height is defined along the stacking direction of the first stack and the second stack. In particular, the vertical height is defined along the stacking direction which defines the direction along which the layers of the respective stacks are attached to one another. A vertical height of a cavity is further defined between a surface of stack and the bottom delimiting the respective cavity.

In an embodiment, the first cavity and the second cavity have the same cross-sectional shape, wherein the cross-sectional shape forms one of a rectangular, circular, elliptical and polygonal shape. The cross-sectional shape is defined in the plane, which has a normal parallel to the vertical stacking direction.

In an embodiment, the first cavity and the second cavity have the same volume.

Optionally, the component carrier comprises a component embedded in or mounted on the at least one further electrically insulating layer structure separating the cavities. By such an optional component embedded in the one or more electrically insulating layer structures between the cavities or being surface-mounted on one main surface of such one or more further electrically insulating layer structures (and thereby extending into one of the cavities), a fine-tuning of the electromagnetic properties of the cavities may be optionally achieved. Thus, the component may be configured or may be operable for tuning a microwave filter function of the component carrier. This may be advantageous in terms of tuning the functionality of a high frequency component, such as a high frequency filter, but is optional. Also, for impedance matching, such an embedded component may be useful.

In an embodiment, the electrically conductive coating at least partially lining the wall delimiting in at least one of the cavities has a through hole through which an electrically conductive trace is guided into and/or out of the respective cavity. Hence, the only through-hole(s) of the hermetic electromagnetic shielding provided by the coatings of the cavities may be formed for guiding signals into the cavities and/or out of the cavities. Apart from such a through-hole, a fully circumferential shielding of electromagnetic radiation preventing electromagnetic radiation from propagating from an environment into the cavities and from the cavities to an environment may be advantageously obtained.

In an embodiment, the component carrier comprises a resonator structure in one of the cavities electrically coupled with the electrically conductive trace. Such a resonator structure may be shaped and dimensioned so as to enable only one wavelength of microwaves to form a standing wave in the resonator type cavities. For instance, such a resonator structure may be formed as one or more electrically conductive sheets on the above mentioned further electrically insulating layer structure(s).

In an embodiment, a thickness of a respective one of the connection bodies is substantially the same as a thickness of an adhesive electrically insulating structure adhesively connecting the stacks and being arranged laterally adjacent to the respective connection body. By taking this measure, it may be reliably prevented that electrically insulating material (such as resin) flows into the cavities. This is mechanically disabled by the presence of the connection bodies having the same overall thickness as the one or more adhesive electrically insulating structure(s).

In an embodiment, a ratio between height and length of at least one of the connection bodies is smaller than 1, in particular smaller than 0.5. Hence, the aspect ratio of the each of the connection bodies may be significantly lower than typical aspect ratios of conventional copper-filled vias.

In an embodiment, the method comprises forming the first exposed planar electrically conductive surface to protrude beyond a rest of the first stack. Correspondingly, the method may comprise forming the second exposed planar electrically conductive surface to protrude beyond a rest of the second stack. By protruding beyond the rest of the respective stack, the respective connection body may be brought in close spatial vicinity with the opposing and cooperating other connection body. This may simplify formation of the at least partially mechanically formed connection between the connection bodies via their planar exposed electrically conductive surfaces.

In an embodiment, the method comprises pressing the first exposed planar electrically conductive surface and the second exposed planar electrically conductive surface together for establishing the mechanical connection between. Such a pressing the exposed planar electrically conductive surfaces for establishing a mutual connection may be carried out for example simultaneously with a lamination procedure of connecting the stacks together using an at least partially uncured material (such as epoxy resin) for curing and thereby forming an adhesive connection between the stacks. Thus, adhesively connecting the stacks and mechanically connecting the exposed planar electrically conductive surfaces may be carried out simultaneously.

In an embodiment, the method comprises pressing the first exposed planar electrically conductive surface and the second exposed planar electrically conductive surface together without pressing the first exposed planar electrically conductive surface and the second exposed planar electrically conductive surface through an electrically insulating solid material. By avoiding the connection bodies with their exposed planar electrically conductive surfaces to extend or pierce through electrically insulating material, a reliable mechanical connection between the connection bodies may be established via their exposed planar electrically conductive surfaces.

In an embodiment, the method comprises connecting the first connection body and the second connection body as two separately preformed bodies. Hence, the connection bodies may already be readily manufactured (and therefore in a predefined shape and configuration) at the point of time of connecting them for establishing an electrically conductive connection between the connection bodies. This makes the formation of the connection simple and quick.

In an embodiment, the method comprises impedance matching the first exposed planar electrically conductive surface and the second exposed planar electrically conductive surface. Thus, an impedance controlled electric connection may be provided. Impedance may be denoted as the sum of the resistance and reactance (composed, in turn, of capacitance and inductance) of an electrical circuit. According to the described embodiment, an impedance control may be implemented by the two connected connection bodies. By such an impedance matching, any undesired reflection of electromagnetic signals at an interface between the connection bodies may be prevented. Such an impedance matching may improve the electrical performance of the component carrier.

In an embodiment, the method comprises interposing at least one further electrically insulating layer structure between the first stack, comprising a first cavity, and the second stack, comprising a second cavity, wherein the at least one further electrically insulating layer structure may be traversed for electrically coupling the connected connection bodies. In such an embodiment, the further electrically insulating layer structure may for instance be or form part of a third stack. In particular, all three stacks may be cores, i.e., fully cured dielectric layer structures, optionally comprising electrically conductive layer structures.

In another embodiment, a respective one of the connection bodies comprises a surface finish at the respective exposed planar electrically conductive surface. For example, such a surface finish may be a corrosion protection.

In an embodiment, the component carrier is used for 5G. Mobile wireless communication according to the 5G standard involves high-frequency transmission with a high transmitted data volume per time. A component carrier according to an exemplary embodiment of the invention meets these demanding requirements. Fifth generation (5G) networks feature an increased mobile data rate, in particular significantly above 100 Mb/s. Fifth generation communication networks can experience superior network transmission fidelity when implementing a component carrier according to an exemplary embodiment of the invention.

In an embodiment, the component carrier is used for high-frequency applications above 1 GHz, in particular above 100 GHz. In particular for such high frequencies, signal transmission is particularly prone to distortions. The high performance of component carriers according to exemplary embodiments of the invention allows low loss signal transmission even with such high-frequency values. In an embodiment, the component carrier is used for a high-frequency application in a wavelengths range between micrometers and millimeters, or below.

In particular, exemplary embodiments can be used for high power applications as well (for instance for establishing an interconnection between two very wide traces, such as power traces, or ground planes) to reduce transition resistance). For high-power applications, a frequency range may be from DC (direct current) to 100 GHz.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board. A plate-shaped component carrier also ensures short electric connection paths, and therefore suppresses signal distortion during transport.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photoimageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene, a ceramic, and a metal oxide. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high-frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier further comprises an electronic component mounted on and/or embedded in the component carrier material, in particular in the stack. For instance, the electronic component may be a radio-frequency semiconductor chip configured for emitting and/or receiving radiofrequency signals via the wiring structures and being electrically coupled with the electrically conductive wiring structures. Hence, the electronic component may be configured for executing a radio-frequency application, in particular a radio-frequency application involving frequencies above 1 GHz.

At least one component may be surface mounted on and/or embedded in the component carrier and can in particular be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are OSP (Organic Solderability Preservative), Electroless Nickel Immersion Gold (ENIG), gold (in particular Hard Gold), chemical tin, nickel-gold, nickel-palladium, etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
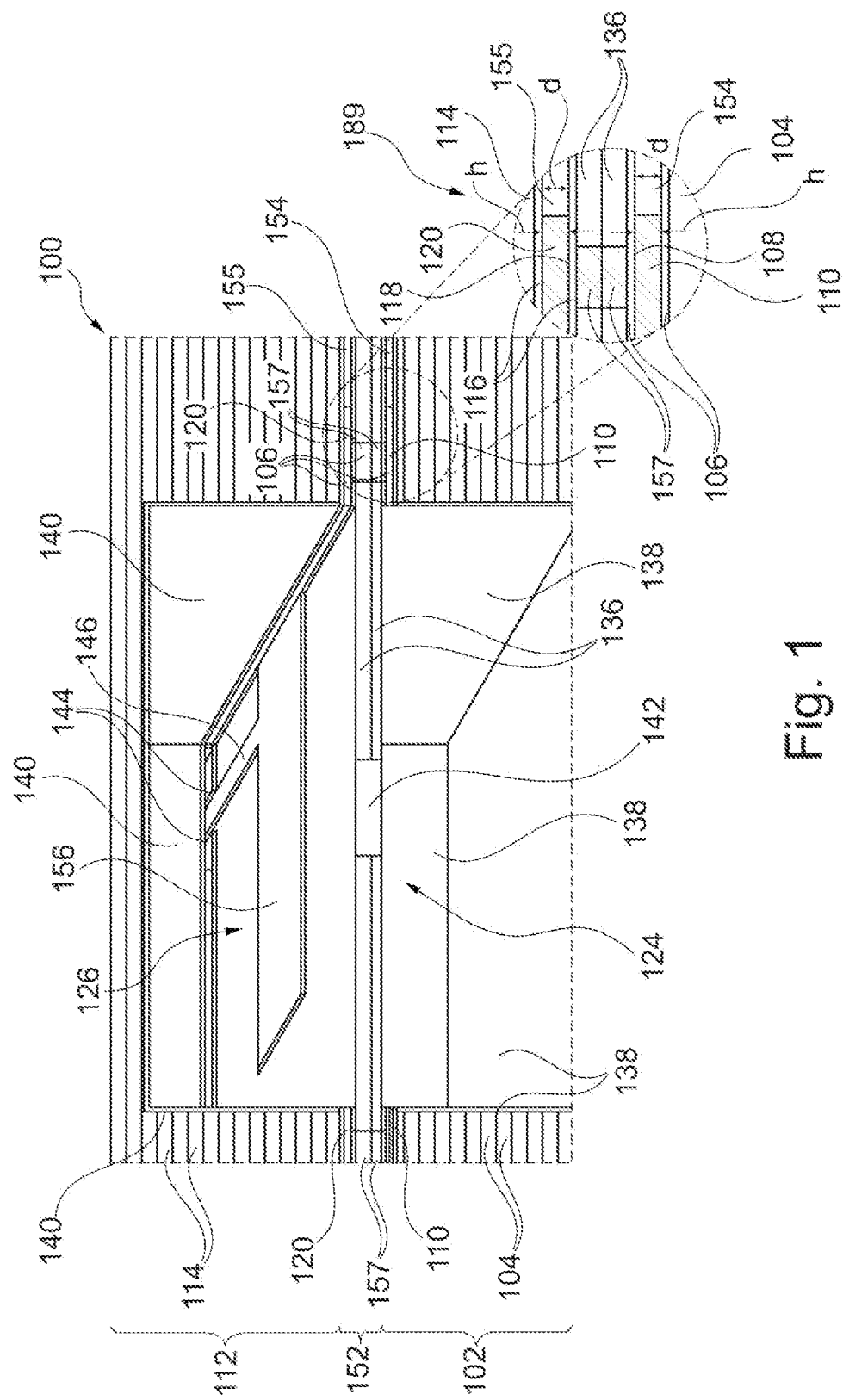
FIG. 1 illustrates a three-dimensional cross-sectional view of a component carrier according to an exemplary embodiment of the invention.

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

According to an exemplary embodiment of the invention, a component carrier (such as a printed circuit board, PCB) is provided which accomplishes a vertical electric connection by a two-dimensional connection of readily manufactured connection bodies, i.e., in particular by forming a copper cladding, instead of oblong vias.

Conventionally, oblong plated vias have been used to establish an electrical connection between different planes or layers of a component carrier. As the vias cannot be placed directly at the edge of a cavity formed in the component carrier, an electromagnetic field coupled into the cavity may also propagate through a high loss no-flow prepreg. This may in turn lead to a drop of the quality factor of the component carrier. In addition, in the mentioned scenario, there is the possibility of undesired prepreg spillage which may decrease the performance of a microwave structure formed in the component carrier quite drastically.

Furthermore, as plated through hole vias are placed after pressing different cores together, the drills for forming the vias can break a seal of the cavity which may lead to spillage of plating chemistry (from plating the vias) inside the cavity. Increasing the distance of the vias to the cavity edge may circumvent this issue. However, this may lead to higher losses as more prepreg is interacting with the RF field.

Moreover, using vias and plated through holes additionally have the following drawbacks. Vias and plated through holes may suffer from a strict shape restriction, due to the geometry of the via holes formed by a drilling process. Furthermore, a minimum required distance between adjacent vias limits miniaturization. In terms of cavity formation for high-frequency applications, adhesive prepreg may intrinsically form part of an electromagnetic shield, which decreases reliability and efficiency.

According to an exemplary embodiment of the invention, a two-dimensional connection of two (or more) previously formed connection bodies relating to different layer stacks combined for manufacturing a component carrier may provide a copper cladding architecture as replacement for the concept of buried vias. A corresponding manufacturing method, see for instance FIG. 1, may also make advantageous use of a modified semi-additive process (mSAP). For instance, it may be possible to build up two electrically conductive walls (as example for the connection bodies) that may be connected during a pressing process of pressing together layer stacks for also connecting the connection bodies. Advantageously, such a manufacturing method does not involve any shape restriction to the connection bodies. Benefits can be made from the fact that the connection bodies can be placed directly at the needed position (for instance in a cavity) of the component carrier. Applying this concept may allow creating a substantially continuous shield against electromagnetic radiation. Moreover, any influence of glue on the RF performance may be advantageously avoided. In particular, an exemplary embodiment of the invention may create a substantially fully closed metal shield around an RF critical structure. For instance, such embodiments may be used for substrate integrated waveguides, air cavity structures (i.e., a tunable filter, advantageously with one footprint for different frequency bands), air filled substrate integrated waveguides, forming an impedance matched interconnection between two signal traces (for instance high speed and RF signals), etc.

According to an exemplary embodiment of the invention, a component carrier (in particular a printed circuit board, PCB) is provided which is specifically able to process high-frequency signals with low signal loss and high accuracy. In particular, copper walls may be provided as mutually connected connection bodies with exposed planar electrically conductive surfaces which may prevent that an adhesive material (for instance prepreg flowing during curing) flows into undesired spaces, such as a cavity within the component carrier. Furthermore, such an architecture of mutually connecting different stacks of a component carrier may allow to freely select the shape and dimension of the connected connection bodies and their exposed planar electrically conductive surfaces. This may be used advantageously, for instance for high-frequency applications, to carry out a proper impedance matching by an adjustment of the form factor of the connection bodies. Highly advantageously, the connection bodies may be connected within the component carrier so that electric signals or electric current are/is guided along the connection bodies during operation of the component carrier. Thus, in addition to their mechanical coupling function, the connection bodies with their exposed planar electrically conductive surfaces may also contribute to the electronic functionality of the component carrier.

An embodiment providing the above and other advantages will be described in the following in detail referring to FIG. 1.

FIG. 1 illustrates a three-dimensional cross-sectional view of a component carrier 100 according to an exemplary embodiment of the invention.

The illustrated component carrier 100 comprises a first layer stack 102 having multiple first electrically insulating layer structures 104 and multiple first electrically conductive layer structures 106 including a wall-shaped electrically conductive first connection body 110 with a first exposed planar electrically conductive surface 108 (see also detail 189). Furthermore, the component carrier 100 comprises a second layer stack 112 which comprises, in turn, multiple second electrically insulating layer structures 114 and multiple second electrically conductive layer structures 116 comprising a wall-shaped electrically conductive second connection body 120 with a second exposed planar electrically conductive surface 118.

As shown, a third layer stack 152 may be vertically sandwiched between the first layer stack 102 and the second layer stack 112. Also, the third layer stack 152 may comprise electrically conductive layer structures (see, flat vertical interconnect bodies 157) and further electrically insulating layer structures 136.

Referring to FIG. 1, the electrically insulating layer structures 104, 114, 136 may for instance comprise resin (such as epoxy resin), optionally comprising reinforcing particles such as glass fibers. For instance, the electrically insulating layer structures 104, 114 may be made of prepreg. The electrically conductive layer structures 106, 116, including the connection bodies 110, 120 and the flat vertical interconnect bodies 157 may be patterned copper layers laminated onto opposing main surfaces of the electrically insulating layer structures 104, 114 and/or may be plated copper structures.

For instance, the first, second and third stacks 102, 112, 152 may be manufactured based on fully cured cores with laminated copper foils. Stacks 102, 112, 152 may be interconnected by curing previously uncured adhesive electrically insulating structures 154, 155 in between by lamination, i.e., the application of heat and/or pressure. Hence, the component carrier 100 according to FIG. 1 may be configured as a plate-shaped laminate-type component carrier 100, in particular a printed circuit board (PCB).

Advantageously, the first exposed planar electrically conductive surface 108 of connection body 110 and the second exposed planar electrically conductive surface 118 of connection body 120 are mechanically connected with flat vertical interconnect bodies 157 of interposed third layer stack 152 in between to establish a vertical two-dimensional electrically conductive connection between first- and second-layer stacks 102, 112 via third layer stack 152. Thus, the third stack 152 is connected between the first stack 102 and the second stack 112 so that the connection bodies 110, 120 electrically connect the first stack 102 with the second stack 112 through the third stack 152. In this context, the first exposed planar electrically conductive surface 108 and the second exposed planar electrically conductive surface 118 are also connected by the vertical interconnect bodies 157. As shown, the first exposed planar electrically conductive surface 108 and the second exposed planar electrically conductive surface 118 may have the same shape and the same surface area. Moreover, the first exposed planar electrically conductive surface 108 and the second exposed planar electrically conductive surface 118 are arranged in parallel.

As shown in FIG. 1 as well, the first stack 102 comprises a first cavity 124 and the second stack 112 comprises a second cavity 126. The first cavity 124 is separated from the second cavity 126 by the further electrically insulating layer structures 136 of the third stack 152. Laterally apart from the cavities 124, 126, the third stack 152 is traversed by the vertically interconnect bodies 157 being connected, in turn, to connection bodies 110, 120.

Furthermore, each of the first cavity 124 and the second cavity 126 is almost completely lined or coated with an electrically conductive coating 138, 140, in particular copper, covering the exposed walls of the layer stacks 102, 112 delimiting the cavities 124, 126. The electrically conductive coating 138, 140 is electrically coupled with the wall-shaped connected connection bodies 110, 120 which may extend along the side edges of the cavities 124, 126.

As shown in FIG. 1 as well, an optional component 142 (for instance a semiconductor die or a semiconductor MEMS, microelectromechanical system) is embedded in (or is surface mounted on, not shown) the further electrically insulating layer structures 136.

Beyond this, the electrically conductive coating 140 in cavity 126 has, in a vertical back wall thereof, a through hole 144 through which an electrically conductive trace 146 (preferably made of copper as well) is guided or inserted into the cavity 126. Moreover, a sheet-like resonator structure 156 (preferably made of copper) is formed on the upper further electrically insulating layer structure 136 in cavity 126, and is electrically coupled with the electrically conductive trace 146. In the shown embodiment, it may be advantageous that no resonator structure 156 is present in the first cavity 124.

As shown in detail 189, a vertical thickness, h, of a respective one of the connection bodies 110, 120 is substantially the same as a vertical thickness, d, of the respectively neighbored adhesive electrically insulating structure 154, 155 adhesively connecting the stacks 102, 112, 152 and being arranged laterally adjacent to the respective connection body 110, 120. In other words, for connecting the stacks 102, 112, 152 by lamination, the adhesive electrically insulating structures 154, 155 may become flowable by the application of pressure and/or heat, and may re-solidify when being fully cured. Advantageously, during this lamination procedure for connecting stacks 102, 112, 152, the substantially (for instance with a tolerance of ±10%) identical thicknesses h=d of connection bodies 110, 120 and assigned adhesive electrically insulating structure 154, 155 ensure that no resin of the adhesive electrically insulating structures 154, 155 flows into the cavities 124, 126. This keeps high-frequency losses small.

FIG. 1 illustrates component carrier 100 having a resonator for creating an electromagnetic wave. The resonator volume is formed by the combination of the first cavity 124 and the second cavity 126. The cavities 124, 126 are separated by the further electrically insulating layer structures 136, which may form part of the third stack 152 between the first stack 102 and the second stack 112. For example, all three stacks 102, 112, 152 may be cores, i.e., fully cured layer stacks comprising electrically insulating material such as FR4, and copper as electrically conductive material. A signal to be filtered in the resonator can be supplied to the resonator via inlet trace 146. Through-hole 144 is formed in the copper coated back wall delimiting the second cavity 126 to guide the high-frequency signal into the second cavity 126. Via trace 146, the signal propagates to resonator structure 156, i.e., a patterned copper sheet on the top main surface of the further electrically insulating layer structures 136 and extending into the second cavity 126. Optionally, component 142 (such as an RF component) may be embedded in the one or more further electrically insulating layer structures 136 (as shown), or may be surface-mounted on the upper main surface or the lower main surface of the one or more further electrically insulating layer structures 136. For instance, the component 142 may be a MEMS switch which may be configured for rendering the frequency filter according to FIG. 1 tunable. Said component 142 may thus allow a fine-tuning of the filter characteristics of the resonator. After propagating into the resonator, the electromagnetic signal supplied via trace 146 may generate a standing wave in the resonator volume formed by the cavities 124, 126. Thus, the component carrier 100 shown in FIG. 1 may function as a frequency filter.

It should however be said that the component 142 is optional and might also be omitted. In such an embodiment, the adjustment of the filter characteristics of the resonator shown in FIG. 1 can be accomplished by shaping and dimensioning the cavities 124, 126 accordingly.

As shown, substantially the entire circumference of the resonator volume delimited by the cavities 124, 126 is formed as an electrically conductive shielding structure by the substantially continuous coating 138, 140 with the only exception of the at least one through-hole 144 used for coupling the electromagnetic signal into the resonator volume. Thus, a proper electromagnetic shielding being fully hermetic with exception of the through-hole 144 only may be provided. This prevents undesired propagation of electromagnetic radiation from an environment into the cavities 124, 126, as well as from the cavities 124, 126 to an environment.

As furthermore shown, the connection bodies 110, 120 are electrically connected to the coatings 138, 140. Hence, all said electrically conductive structures are electrically coupled or are brought to the same electric potential. Moreover, the copper walls provided by the connection bodies 110, 120 ensures that no prepreg material flows into the cavities 124, 126 during a lamination process of connecting stacks 102, 112, 152.

For instance, the one or more further electrically insulating layer structures 136 may be made of a specific high frequency dielectric, i.e., ensuring low loss in the event of electromagnetic radiation propagating in the resonator. Alternatively, the further electrically insulating layer structures 136 may also be made of FR4.

As shown, the first connection body 110 is located at a top surface of the first stack 102 laterally adjacent to adhesive insulating layer structure 154. Correspondingly, the second connection body 120 is positioned at a lower main surface of the second stack 112, laterally adjacent to further adhesive electrically insulating structure 155. During connecting the stacks 102, 112, 152 by lamination, the previously uncured material of the adhesive electrically insulating structures 154, 155 may become flowable, start cross-linking and will then re-solidify. Since the vertical height of the respective connection body 110, 120 and the respectively adjacent or lateral connected previously uncured adhesive insulating structure 154, 155 is the same, flowable resin is prevented from flowing into the cavities 124, 126. The identical height of the connection bodies 110, 120 compared to the vertical height of the respective adhesive insulating structure 154, 155 ensures that the Faraday cage defined by the connection bodies 110, 120, the vertical interconnect(s) 157 and the coatings 138, 140 remains substantially uninterrupted (with the only exception of the through-hole 144 in the back wall of the second cavity 126). Therefore, a proper electromagnetic shielding may be obtained while at the same time avoiding prepreg material from flowing into the cavities 124, 126 (which may negatively influence the filter performance of the resonator). Connecting the connection bodies 110, 120 by pressing them together after having already readily manufactured them additionally improves the freedom of design concerning the shapes of the connection bodies 110, 120.

By providing the vertical interconnection between stacks 102, 112 by mechanically coupling the opposing planar parallel flange faces of connection bodies 110, 120 by flat vertical interconnect bodies 157 rather than by oblong structures, a built up copper wall may be implemented to connect the various planes or layer levels, respectively. The flat vertical interconnect bodies 157 can, for instance, be a micro via or can be created in another way. This may advantageously involve a low prepreg height. As the gap for the feeding line gets rather small, any potential issues can be avoided by optionally milling a feeding line channel in the lid. The copper clads in form of the interconnected connection bodies 110, 120 may be made out of two parts, which may be pressed together and held in place by the adhesion of the prepreg.

Benefits of the shown embodiment are that no prepreg can spill into the cavities 124, 126 and that more of the RF field may be confined in air. Furthermore, the low loss core, as the copper clad, may be advantageously placed directly at the edge of the respective cavity 124, 126. This may lead to a significant increase of the quality factor (Q factor) of the microwave filter function provided by the component carrier 100, as confirmed by a simulation.

The shown exemplary embodiment of the invention may contribute to reduce the transmission losses of RF critical applications compared to conventional PCB bound transmission methods. Such an embodiment may further offer a similar performance as substrate integrated waveguides with the benefits of planar technologies (i.e., high design freedom). The shown exemplary embodiment may function as a filter in form of an embedded suspended stripline substrate. As a highly resonant structure responds to manufacturing tolerances quite drastically, this is a good indicator that the manufacturing technique is highly appropriate for the specified frequency range. As the embedded suspended stripline substrate has similar design restrictions as microstrip or stripline structures, also all other system components (such as transmission/feeding lines, couplers, etc.) that can be manufactured in planar technology are producible with embedded suspended stripline substrate.

The illustrated embodiment of component carrier 100 is designed to operate close to the start of the mm-wave range (30 GHz). However, other exemplary embodiments of the invention may also be designed for use in lower and higher frequency bands.

Figure 2:
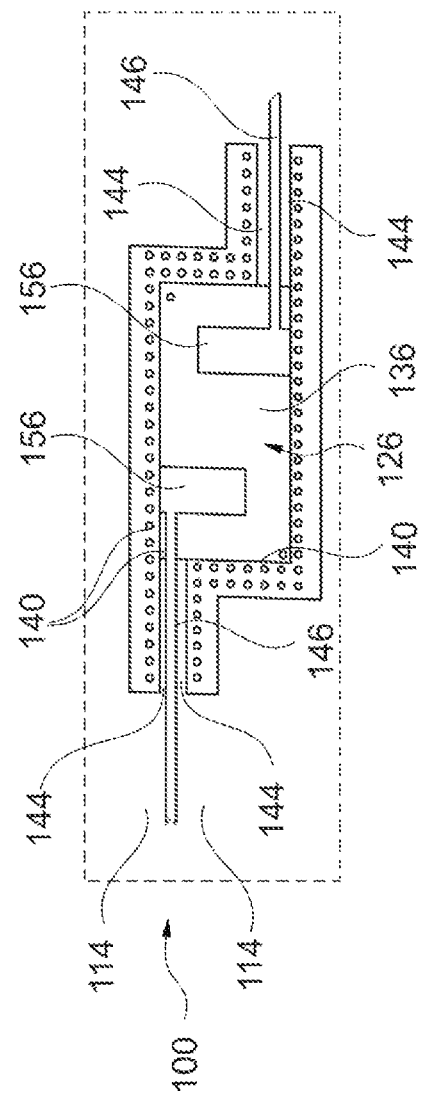
FIG. 2 illustrates a cross-sectional of a component carrier manufactured according to an exemplary embodiment of the invention.

FIG. 2 illustrates a cross-sectional view of a component carrier 100 manufactured according to an exemplary embodiment of the invention.

FIG. 2 shows that the resonator 156 can be duplicated or provided two times in the second cavity 126. It can also be seen that the resonator structures 156 can be short-circuited or directly electrically connected to the surrounding electrically conductive material of coating 140 (and connection body 120). Two through-holes 144 are formed in the surrounding electrically conductive cage, each for guiding a respective trace 146 into the cavity 126.

Figure 3:
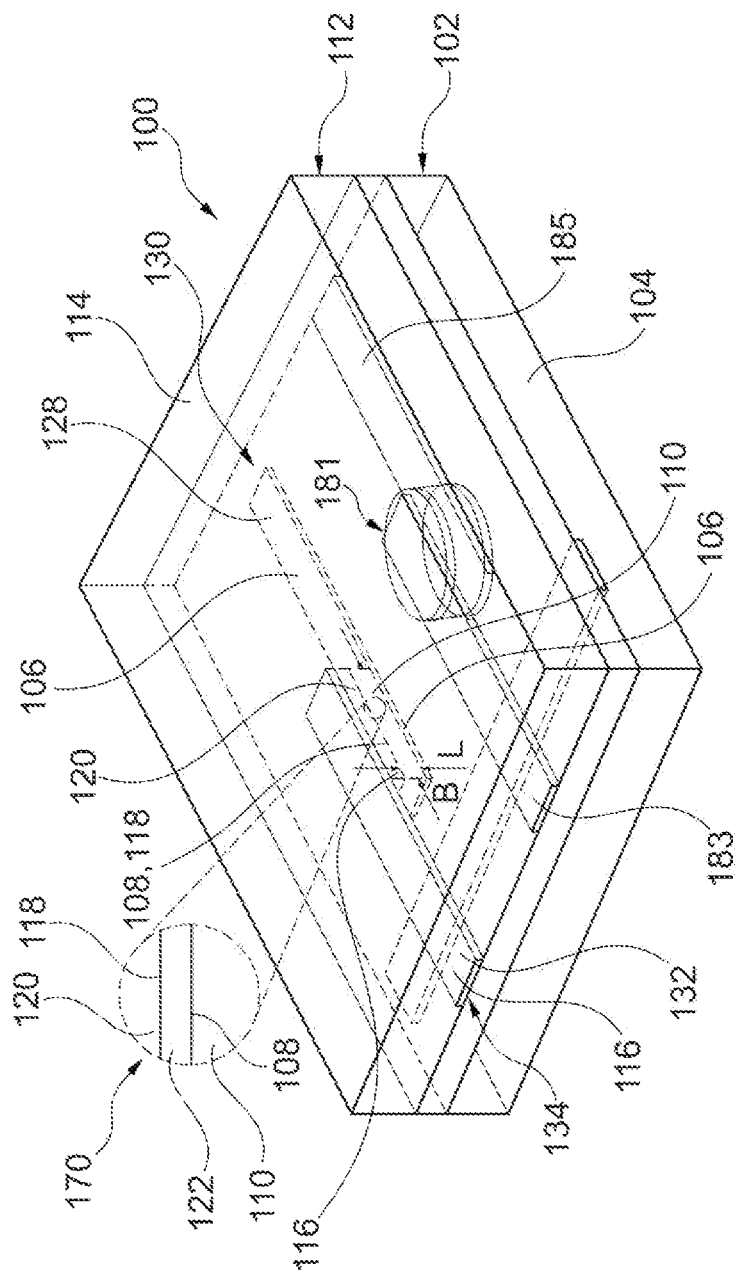
FIG. 3 illustrates a three-dimensional view of a component carrier according to another exemplary embodiment of the invention.

FIG. 3 illustrates a three-dimensional view of a component carrier 100 according to another exemplary embodiment of the invention. The embodiment of FIG. 3 illustrates a layer change between horizontal traces 128, 132 extending in different parallel planes 130, 134 using a direct or indirect mechanical connection of connection bodies 110, 120.

According to FIG. 3, the first electrically conductive layer structures 106 comprise first electrically conductive trace 128 in first plane 130 and connected with the vertically protruding first connection body 110 with rectangular cross-section. Correspondingly, the second electrically conductive layer structures 116 comprise second electrically conductive trace 132 in second plane 134 and connected with the vertically protruding second connection body 120 having the same rectangular cross-section as the first connection body 110. Moreover, the electrically conductive traces 128, 132 in the different planes 130, 134 are interconnected by the connected connection bodies 110, 120.

According to detail 170 of FIG. 3, the first exposed planar electrically conductive surface 108 and the second exposed planar electrically conductive surface 118 are connected by an electrically conductive connection medium 122, such as a sinter paste. Such an indirect connection may keep the connection resistance low. Alternatively and not shown, the first exposed planar electrically conductive surface 108 and the second exposed planar electrically conductive surface 118 may also be in direct physical contact with each other, in particular without electrically conductive connection medium 122 in between. This may allow for a particular simple establishment of an electric connection, i.e., a merely mechanical connection.

As illustrated in FIG. 3, a ratio between vertical height, L, and horizontal length, B, of each of the connection bodies 110, 120 may be very small, for instance smaller than 0.2.

As can be taken from FIG. 3 as well, both the first connection body 110 and the second connection body 120 has a non-circular cross-section with rectangular shape. The design freedom concerning selection of this shape is high due to the described manufacturing concept.

As shown, the first exposed planar electrically conductive surface 108 and the second exposed planar electrically conductive surface 118 are mechanically connected to establish a vertical whole surface electrically conductive connection. In other words, the entire first exposed planar electrically conductive surface 108 is connected to the entire second exposed planar electrically conductive surface 118. This design may ensure that the first exposed planar electrically conductive surface 108 and the second exposed planar electrically conductive surface 118 are impedance matched. As a result, high-frequency losses may be small.

Also, the embodiment of FIG. 3 shows that exemplary embodiments of the invention can replace buried vias in thin prepreg layers and can control the shape of this electrical connection, which is not easily possible for vias.

FIG. 3 thus shows how the traces 128, 132 in the different planes 130, 134 can be interconnected by a vertical interconnect structure composed of the two connection bodies 110, 120 with rectangular cross-section being connected at exposed planar electrically conductive surfaces 108, 118. Detail 170 shows connection medium 122, such as a solder or sinter material, which can be sandwiched between the exposed planar electrically conductive surfaces 108, 118 connected by pressing, for instance to decrease a connection resistance between the connection bodies 110, 120, if desired or required.

In contrast to a conventional copper-filled via 181 with circular cross-section connecting traces 183, 185 in different planes, the connection by the mechanically connected connection bodies 110, 120 can be properly impedance matched and shows a high freedom of design concerning used geometries. Thus, a layer change can be accomplished with higher accuracy and freedom of design according to exemplary embodiments of the invention. The connection bodies 110, 120 can again be configured as mutually press-connected copper walls, i.e., two readily manufactured copper bodies being connected by mutual pressing.

Figure 4:
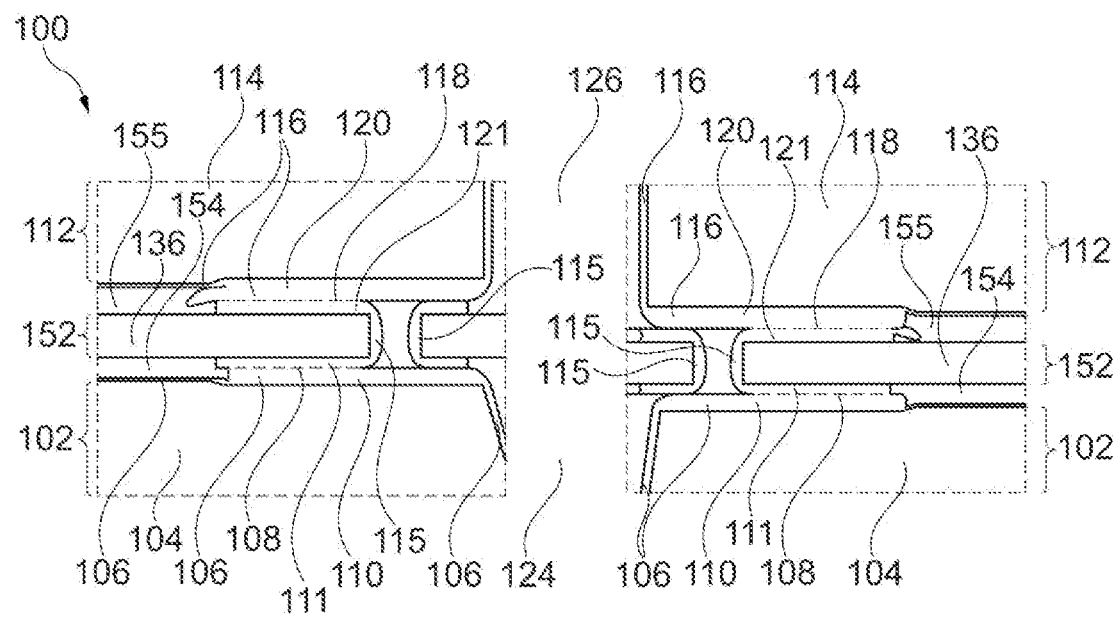
FIG. 4 and FIG. 5 illustrate cross-sectional views of component carriers manufactured according to exemplary embodiments of the invention.
Figure 5:
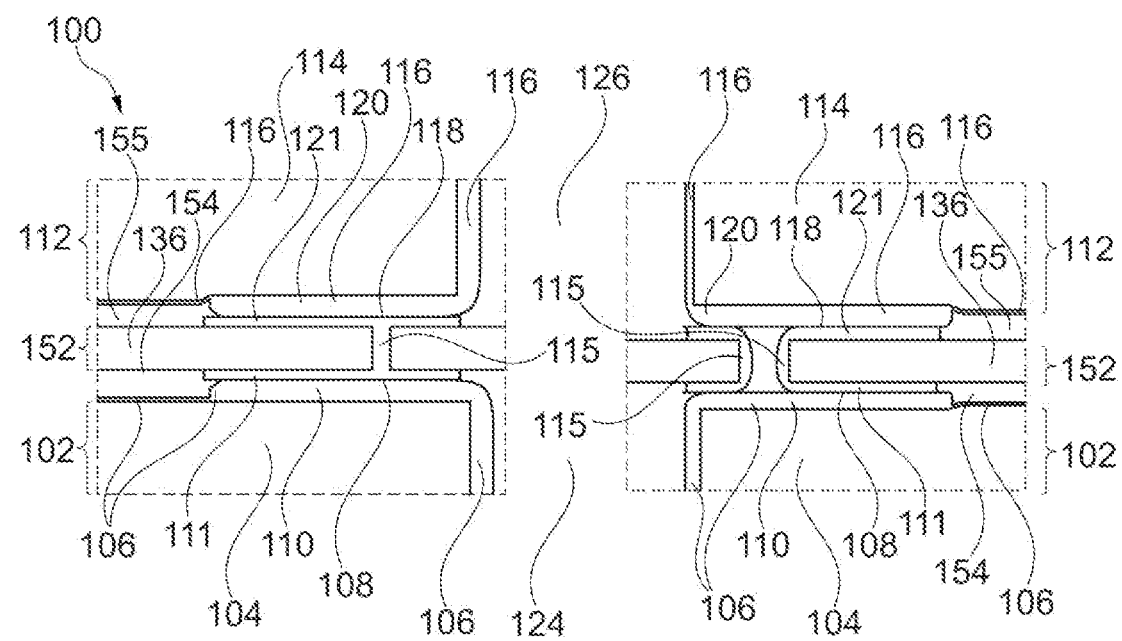

FIG. 4 and FIG. 5 illustrate cross-sectional views of component carriers 100 manufactured according to exemplary embodiments of the invention.

FIG. 4 shows two images between which cavities 124, 126 may be arranged, as indicated schematically in FIG. 4. Thus, the image on the left-hand side shows a left cross-sectional portion of the component carrier 100, whereas the image on the right-hand side shows a right portion of the cross-section of the component carrier 100.

Still referring to FIG. 4, the first connection body 110 belongs to a first copper-clad to which also a further copper layer portion 111 belongs. In other words, the first copper-clad is formed by two halves denoted with reference signs 110, 111. The second connection body 120 belongs to a second copper-clad to which also a further copper layer portion 121 belongs. Hence, the second copper-clad is formed by two halves denoted with reference signs 120, 121. The connection between the stacks 102, 112, 152 is established by connecting said first copper-clad and said second copper-clad. A respective metal filled via, see reference sign 115, is used to establish the electrical contact through the core type stack 152. FIG. 4 (in contrast to FIG. 1) shows in detail the two halves of the respective copper-clad (for simulation of the design of FIG. 1, there is no difference if one or two blocks of copper are implemented). FIG. 4 shows the two copper clads (one above and one below the RF core constituting stack 152), together with the micro vias 115. Both copper-clads may be formed by pressing said two halves of the wall together. Hence, a gist of an embodiment of the invention is related to the two copper clads, whereas the micro via 115 is just an example and can be substituted by copper paste, one more copper blocks, deep routing, laser slots, etc.

The illustration of FIG. 5 corresponds to the illustration in FIG. 4, but shows another example.

Figure 8:
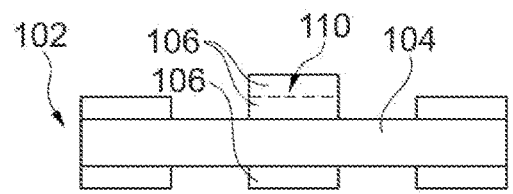
Figure 8:
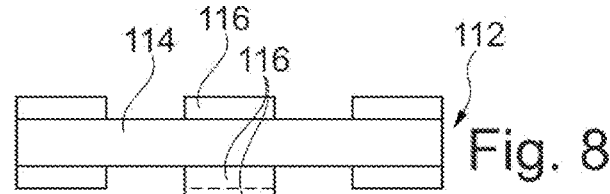
Figure 9:
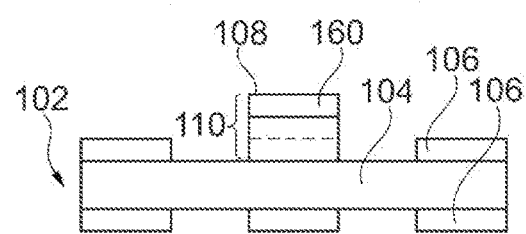
Figure 9:
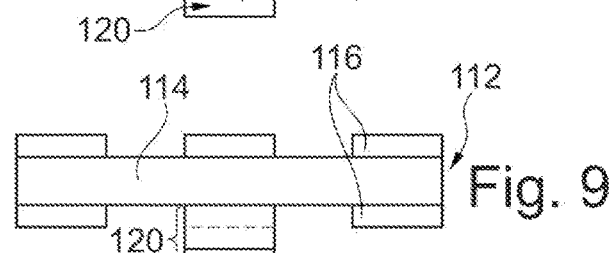
Figure 10:
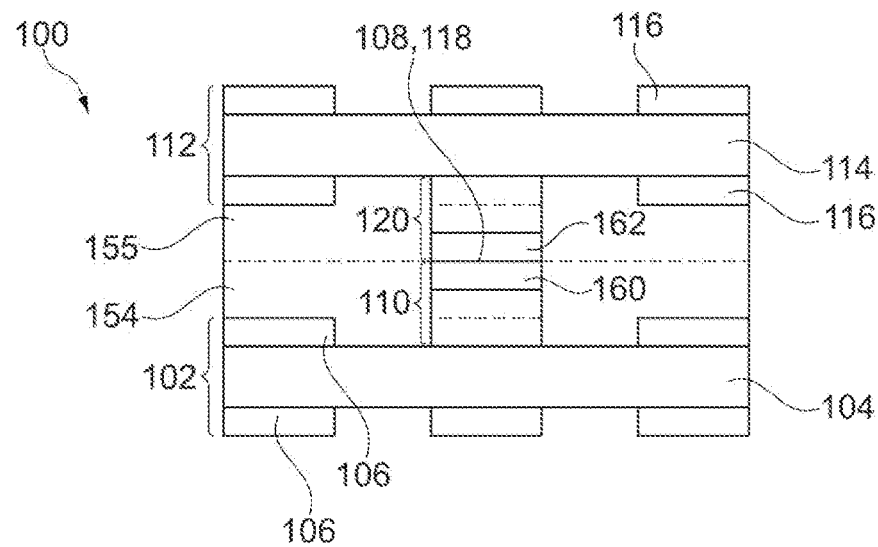

FIG. 6 to FIG. 10 illustrate cross-sectional views of structures obtained during carrying out a method of manufacturing a component carrier 100 according to an exemplary embodiment of the invention, shown in FIG. 10. Also in this embodiment, no pressing of copper through prepreg is necessary, contrary to conventional approaches. Referring to the manufacturing process illustrated in FIG. 6 to FIG. 10, the corresponding left-hand side of FIG. 6 to FIG. 9 shows processing of a first stack 102, while the respective right-hand side of FIG. 6 to FIG. 9 shows processing of a second stack 112. FIG. 10 shows the result of connecting the stacks 102, 112 processed according to FIG. 9.

Figure 6:
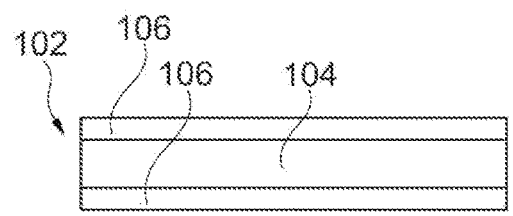
FIG. 6, FIG. 7, FIG. 8, FIG. 9 to FIG. 10 illustrate cross-sectional views of structures obtained during carrying out a method of manufacturing a component carrier according to an exemplary embodiment of the invention, shown in FIG. 10.
Figure 6:
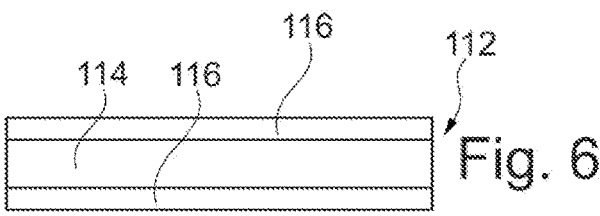

Referring to FIG. 6, first layer stack 102 is provided which comprises first electrically insulating layer structure 104 and first electrically conductive layer structures 106 on both opposing main surfaces of the first electrically insulating layer structure 104. Correspondingly, second stack 112 is provided which comprises second electrically insulating layer structure 114 and second electrically conductive layer structures 116 on both opposing main surfaces of the second electrically insulating layer structure 114. Each of the layer stacks 102, 112 may be embodied as a core with double-sided base copper.

As shown in FIG. 6, each of the stacks 102, 112 may be configured as a core composed of a central electrically insulating layer structure 104, 114 which may for instance be a fully cured FR4 layer, covered on both opposing main surfaces thereof with a respective copper foil or copper layer, as respective electrically conductive layer structure 106, 116.

Figure 7:
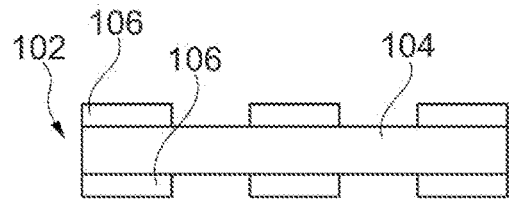
Figure 7:
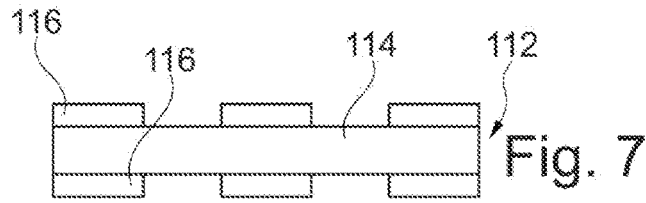

Referring to FIG. 7, the cores illustrated in FIG. 6 may be structured.

In order to obtain the layer structures shown in FIG. 7, the electrically conductive layer structures 106, 116 on both opposing main surfaces of the respective electrically insulating layer structure 104, 114 is patterned. This can be accomplished for instance by a combined lithography and etching procedure.

Referring to FIG. 8, a copper clad may be built up on wanted surfaces.

As shown in FIG. 8, the layer structure shown respectively in FIG. 7 may then be subject of a selective deposition of electrically conductive material on a central section of the upper electrically conductive layer structure 106 of stack 102 and of the lower electrically conductive layer structure 116 of stack 112. As a result, protruding connection bodies 110, 118 are formed.

Referring to FIG. 9, an optional surface finish 160, 162 may be formed on the planar horizontal surfaces of connection bodies 110, 120, or part thereof (not shown).

As shown in FIG. 9, the first exposed planar electrically conductive surface 108 as free end of connection body 110 is formed to protrude beyond a rest of the first stack 102. Correspondingly, the second exposed planar electrically conductive surface 118 as free end of connection body 120 is formed to protrude beyond a rest of the second stack 112.

Referring to FIG. 9, the protruding connection bodies 110, 120 may be selectively made subject of an optional surface finishing process, to thereby create a respective surface finish 160, 162 on a respective exposed surface portion of the respective connection body 110, 120.

Referring to FIG. 10, the shown component carrier 100 is obtained by connecting the upper main surface of the first layer stack 102 as shown in FIG. 9 with the lower main surface of the second layer stack 112 shown in FIG. 9. Adhesive electrically insulating structures 136 may be sandwiched in between the stacks 102, 112 for connection purposes.

Thus, the first exposed planar electrically conductive surface 108 and the second exposed planar electrically conductive surface 118 may be directly interconnected to establish a two-dimensional electrically conductive connection in between. This may be accomplished by pressing the first exposed planar electrically conductive surface 108 and the second exposed planar electrically conductive surface 118 together without pressing the first exposed planar electrically conductive surface 108 and the second exposed planar electrically conductive surface 118 through an electrically insulating solid material. Both the first connection body 110 and the second connection body 120 may be provided as two separately preformed bodies. Both connection bodies 110, 120 may advantageously comprises a surface finish 160, 162 at the respective exposed planar electrically conductive surface 108, 118. Hence, the processed stacks 102, 112 is shown in FIG. 9 may be pressed together to establish an electrical contact. Optionally, a sinter paste or silver paste may be used in between (compare reference numeral 122 in FIG. 3). The interconnection shape may be cut out of the prepreg forming the adhesive electrically insulating structures 154, 155 for interconnecting stacks 102, 112. Thus, no pressing of copper through prepreg is necessary.

Further exemplary aspects are described as follows.

Aspect 1 is directed to a component carrier including a first stack comprising at least one first electrically insulating layer structure and at least one first electrically conductive layer structure, the at least one first electrically conductive layer structure having a first connection body with a first exposed planar electrically conductive surface; a second stack comprising at least one second electrically insulating layer structure and at least one second electrically conductive layer structure, the at least one second electrically conductive layer structure having a second connection body with a second exposed planar electrically conductive surface; wherein the first stack and the second stack are connected with each other so that the first exposed planar electrically conductive surface and the second exposed planar electrically conductive surface are connected to establish a vertical two-dimensional electrically conductive connection.

Aspect 2 includes the component carrier according to aspect 1, including at least one of the following features: wherein the first exposed planar electrically conductive surface and the second exposed planar electrically conductive surface are connected to establish an electrically conductive connection in between over a whole surface area of the first exposed planar electrically conductive surface and a whole surface area of the second exposed planar electrically conductive surface; wherein the first exposed planar electrically conductive surface and the second exposed planar electrically conductive surface have substantially the same shape and/or substantially the same surface area; wherein the first exposed planar electrically conductive surface and the second exposed planar electrically conductive surface are parallel.

Aspect 3 includes the component carrier according to aspect 1, including one of the following features: wherein the first exposed planar electrically conductive surface and the second exposed planar electrically conductive surface are connected by at least one of a vertical interconnect body and an electrically conductive connection medium between the first exposed planar electrically conductive surface and the second exposed planar electrically conductive surface; wherein the first exposed planar electrically conductive surface and the second exposed planar electrically conductive surface are in direct contact with each other, in particular in mere physical contact with each other.

Aspect 4 includes the component carrier according to aspect 1, with at least one of the following features: wherein the first connection body forms at least part of a first copper-clad and the second connection body forms at least part of a second copper-clad, and wherein the connection between the first stack and the second stack is established by, in particular directly or indirectly, connecting said first copper-clad and said second copper-clad; wherein at least one of the first connection body and the second connection body has a non-circular cross-section, in particular a rectangular cross-section; wherein at least one of the first exposed planar electrically conductive surface and the second exposed planar electrically conductive surface has a non-circular surface area, in particular a rectangular surface area; wherein the at least one first electrically conductive layer structure comprises a first electrically conductive trace in a first plane and connected with the first connection body, wherein the at least one second electrically conductive layer structure comprises a second electrically conductive trace in a second plane and connected with the second connection body, and wherein the electrically conductive traces in the different planes are interconnected by the connected connection bodies; wherein the first exposed planar electrically conductive surface and the second exposed planar electrically conductive surface are impedance matched.

Aspect 5 includes the component carrier according to aspect 1, wherein the first stack comprises a first cavity and the second stack comprises a second cavity, the first cavity and the second cavity being separated by at least one further electrically insulating layer structure which is traversed by at least one of the connected connection bodies and/or by a vertical interconnect body between the connected connection bodies, wherein in particular at least one of the first cavity and the second cavity is delimited by a wall being at least partially lined with an electrically conductive coating.

Aspect 6 includes the component carrier according to aspect 5, having at least one of the following features: wherein the electrically conductive coating is electrically coupled with at least one of the connected connection bodies; comprising a component embedded in or mounted on the at least one further electrically insulating layer structure, wherein in particular the component is configured or is operable for tuning a microwave filter function of the component carrier; wherein the electrically conductive coating at least partially lining the wall delimiting at least one of the cavities has a through hole through which an electrically conductive trace is guided into the respective cavity, in particular comprising a resonator structure in at least one of the cavities electrically coupled with the electrically conductive trace.

Aspect 7 includes the component carrier according to aspect 1, wherein a thickness of a respective one of the connection bodies is substantially the same as a thickness of an adhesive electrically insulating structure adhesively connecting the stacks and being arranged laterally adjacent to the respective connection body.

Aspect 8 includes the component carrier according to aspect 1, wherein a ratio between a height and a length of at least one of the connection bodies is smaller than 1, in particular smaller than 0.5, particularly smaller than 0.2.

Aspect 9 includes the component carrier according to aspect 1, wherein a respective one of the connection bodies comprises a surface finish defining the respective exposed planar electrically conductive surface.

Aspect 10 includes the component carrier according to aspect 1, comprising a third stack connected between the first stack and the second stack so that the connection bodies electrically connect the first stack with the second stack through the third stack.

Aspect 11 includes the component carrier according to aspect 1, comprising at least one of the following features: at least one component being surface mounted on and/or embedded in the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip; wherein at least one of the electrically conductive layer structures comprises at least one of the group consisting of copper, aluminum, nickel, silver, gold, palladium, and tungsten, any of the mentioned materials being optionally coated with supra-conductive material such as graphene; wherein at least one of the electrically insulating layer structures comprises at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide; wherein the component carrier is shaped as a plate; wherein the component carrier is configured as one of the group consisting of a printed circuit board, and a substrate; wherein the component carrier is configured as a laminate-type component carrier.

Aspect 12 is directed to a method of manufacturing a component carrier. The method includes the steps of providing a first stack comprising at least one first electrically insulating layer structure and at least one first electrically conductive layer structure, the at least one first electrically conductive layer structure having a first connection body with a first exposed planar electrically conductive surface; providing a second stack comprising at least one second electrically insulating layer structure and at least one second electrically conductive layer structure, the at least one second electrically conductive layer structure having a second connection body with a second exposed planar electrically conductive surface; thereafter connecting the first stack and the second stack with each other to thereby connect the first exposed planar electrically conductive surface and the second exposed planar electrically conductive surface to establish a vertical two-dimensional electrically conductive connection.

Aspect 13 includes the method according to aspect 12, comprising at least one of the following features: wherein the method comprises forming the first exposed planar electrically conductive surface to vertically protrude beyond a rest of the first stack; wherein the method comprises forming the second exposed planar electrically conductive surface to vertically protrude beyond a rest of the second stack; wherein the method comprises pressing the first exposed planar electrically conductive surface and the second exposed planar electrically conductive surface together, wherein the method in particular comprises pressing the first exposed planar electrically conductive surface and the second exposed planar electrically conductive surface together without pressing the first exposed planar electrically conductive surface and the second exposed planar electrically conductive surface through electrically insulating solid material; wherein the method comprises connecting the first connection body and the second connection body as two separately preformed bodies; wherein the method comprises impedance matching the first exposed planar electrically conductive surface and the second exposed planar electrically conductive surface; wherein the method comprises interposing at least one further electrically insulating layer structure between the first stack, comprising a first cavity, and the second stack, comprising a second cavity, wherein the at least one further electrically insulating layer structure is traversed for electrically coupling the connected connection bodies.

Aspect 14 includes a method of using a component carrier according to aspect 1 for a high-frequency application and/or for a high-power application.

Aspect 15 includes the method according to aspect 14, comprising at least one of the following features: wherein the component carrier is used for wireless communication, in particular according to 5G; wherein the component carrier is used for a high-frequency application in a frequency range above 1 GHz, in particular above 100 GHz; wherein the component carrier is used for a high-frequency application in a wavelengths range between micrometers and millimeters, or below.

It should be noted that the term "comprising" does not exclude other elements or steps and the use of articles "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
   a first stack comprising at least one first electrically insulating layer structure and at least one first electrically conductive layer structure;
   a second stack comprising at least one second electrically insulating layer structure and at least one second electrically conductive layer structure;
   wherein the first stack and the second stack are connected with each other so that a vertical two-dimensional electrically conductive connection is established,
   wherein the first stack comprises a first cavity and the second stack comprises a second cavity, the first cavity and the second cavity being separated by at least one further electrically insulating layer structure,
   wherein at least one of the first cavity and the second cavity is delimited by a wall being at least partially lined with an electrically conductive coating.

2. The component carrier according to claim 1,
   wherein the at least one first electrically conductive layer structure having a first connection body with a first exposed planar electrically conductive surface,
   wherein the at least one second electrically conductive layer structure having a second connection body with a second exposed planar electrically conductive surface;
   wherein the first stack and the second stack are connected with each other so that the first exposed planar electrically conductive surface and the second exposed planar electrically conductive surface are connected to establish the vertical two-dimensional electrically conductive connection.

3. The component carrier according to claim 2,
   wherein the electrically conductive coating of both cavities is short-circuited by the connection bodies connected via their exposed planar electrically conductive surfaces.

4. The component carrier according to claim 2,
   wherein the electrically conductive coating is electrically coupled with at least one of the connected connection bodies.

5. The component carrier according to claim 2, comprising at least one of the following features:
   wherein the first exposed planar electrically conductive surface and the second exposed planar electrically conductive surface are connected to establish an electrically conductive connection between a surface area of the first exposed planar electrically conductive surface and a surface area of the second exposed planar electrically conductive surface;

wherein the first exposed planar electrically conductive surface and the second exposed planar electrically conductive surface have substantially the same shape and/or substantially the same surface area;

wherein the first exposed planar electrically conductive surface and the second exposed planar electrically conductive surface are parallel;

wherein the first exposed planar electrically conductive surface and the second exposed planar electrically conductive surface are connected by at least one of a vertical interconnect body and an electrically conductive connection medium between the first exposed planar electrically conductive surface and the second exposed planar electrically conductive surface;

wherein the first exposed planar electrically conductive surface and the second exposed planar electrically conductive surface are in direct contact with each other;

wherein the first connection body forms at least part of a first copper-clad and the second connection body forms at least part of a second copper-clad, and wherein the connection between the first stack and the second stack is established by directly or indirectly, connecting said first copper-clad and said second copper-clad;

wherein at least one of the first connection body and the second connection body has a non-circular cross-section;

wherein at least one of the first exposed planar electrically conductive surface and the second exposed planar electrically conductive surface has a non-circular surface area;

wherein the at least one first electrically conductive layer structure comprises a first electrically conductive trace in a first plane and connected with the first connection body, wherein the at least one second electrically conductive layer structure comprises a second electrically conductive trace in a second plane and connected with the second connection body, and wherein the electrically conductive traces in the different planes are interconnected by the connected connection bodies;

wherein the first exposed planar electrically conductive surface and the second exposed planar electrically conductive surface are impedance matched;

wherein a resonator structure in at least one of the cavities electrically is coupled with the electrically conductive trace.

6. The component carrier according to claim 2, wherein a thickness of a respective one of the connection bodies is substantially the same as a thickness of an adhesive electrically insulating structure adhesively connecting the stacks and being arranged laterally adjacent to the respective connection body, wherein a ratio between a height and a length of at least one of the connection bodies is smaller than 1, wherein a respective one of the connection bodies comprises a surface finish defining the respective exposed planar electrically conductive surface.

7. The component carrier according to claim 1, wherein the electrically conductive coating is a copper layer.

8. The component carrier according to claim 1, wherein at least one of the first cavity and the second cavity is lined with the electrically conductive coating with an exception of one or more through-holes.

9. The component carrier according to claim 8, wherein the electrically conductive coating at least partially lining the wall delimiting at least one of the cavities has a through hole through which an electrically conductive trace is guided into the respective cavity.

10. The component carrier according to claim 1, wherein both, the first cavity and the second cavity are delimited by the wall being at least partially lined with an electrically conductive coating, wherein the electrically conductive coating of both cavities is short-circuited.

11. The component carrier according to claim 1, further comprising:
a component embedded in or mounted on the at least one further electrically insulating layer structure.

12. The component carrier according to claim 11, wherein the component is configured or is operable for tuning a microwave filter function of the component carrier.

13. The component carrier according to claim 1, further comprising:
a resonator structure arranged in one of the cavities.

14. The component carrier according to claim 13, wherein the resonator structure is shaped and dimensioned so as to enable only one wavelength of microwaves.

15. The component carrier according to claim 1, wherein the wall delimiting the first cavity and the second cavity forms a smooth surface.

16. The component carrier according to claim 1, wherein the first cavity and the second cavity have the same vertical height, or wherein a respective vertical height of the first cavity and the second cavity differ from one another by less than 100 μm.

17. The component carrier according to claim 1, wherein the first cavity and the second cavity have the same cross-sectional shape, wherein the cross-sectional shape forms one of a rectangular, circular, elliptical and polygonal shape.

18. The component carrier according to claim 1, wherein the first cavity and the second cavity have the same volume.

19. The component carrier according to claim 1, further comprising:
a third stack connected between the first stack and the second stack so that the connection bodies electrically connect the first stack with the second stack through the third stack.

20. A method of manufacturing a component carrier, comprising:
providing a first stack comprising at least one first electrically insulating layer structure and at least one first electrically conductive layer structure;
providing a second stack comprising at least one second electrically insulating layer structure and at least one second electrically conductive layer structure;
thereafter connecting the first stack and the second stack with each for establishing a vertical two-dimensional electrically conductive connection,
forming a first cavity in the first stack and a second cavity in the second stack, the first cavity and the second cavity being separated by at least one further electrically insulating layer structure,
wherein at least one of the first cavity and the second cavity is delimited by a wall being at least partially lined with an electrically conductive coating.

* * * * *